(12) United States Patent
Kutz et al.

(10) Patent No.: US 8,760,195 B2
(45) Date of Patent: Jun. 24, 2014

(54) SIGNAL PATH AWARE ROUTING OF SUPPLY VOLTAGES

(75) Inventors: Harold Kutz, Edmonds, WA (US); Hans Klein, Pleasanton, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 170 days.

(21) Appl. No.: 13/536,844

(22) Filed: Jun. 28, 2012

(65) Prior Publication Data

US 2013/0265081 A1 Oct. 10, 2013

Related U.S. Application Data

(60) Provisional application No. 61/621,408, filed on Apr. 6, 2012.

(51) Int. Cl.
 *H03K 19/177* (2006.01)
(52) U.S. Cl.
 USPC .................................. 326/41; 326/38; 326/47
(58) Field of Classification Search
 USPC ............................... 326/37–41, 47
 See application file for complete search history.

(56) References Cited

U.S. PATENT DOCUMENTS

| | | | |
|---|---|---|---|
| 5,694,327 A | 12/1997 | Schurig et al. | |
| 6,239,485 B1 | 5/2001 | Peters et al. | |
| 6,601,222 B1 | 7/2003 | Mehrotra et al. | |
| 6,944,842 B1 | 9/2005 | Trimberger | |
| 7,197,736 B2 | 3/2007 | Saxena et al. | |
| 7,573,725 B2 | 8/2009 | Nicolaisen | |
| 8,095,903 B2 | 1/2012 | Birch et al. | |
| 8,104,011 B1 | 1/2012 | Sundararajan et al. | |
| 8,171,441 B2 | 5/2012 | McElvain et al. | |
| 8,487,655 B1* | 7/2013 | Kutz et al. | 326/86 |
| 2005/0028124 A1* | 2/2005 | Gedamu et al. | 716/12 |
| 2008/0111581 A1* | 5/2008 | Wong et al. | 326/37 |
| 2010/0182509 A1 | 7/2010 | Van Rens et al. | |
| 2013/0263073 A1* | 10/2013 | Gentry et al. | 716/112 |

FOREIGN PATENT DOCUMENTS

JP 20000259695 A 9/2000

OTHER PUBLICATIONS

Zhang, T. et al. (Date Unknown). "Simultaneous Sheild and Buffer Insertion for Crosstalk Noise Reduction in Global Routing," Department of Electrical and Computer Engineering, Univerisyt of Minnesota, 14 pages.

USPTO Non Final Rejection for U.S. Appl. No. 14/137,635 dated Mar. 12, 2014; 4 pages.

* cited by examiner

*Primary Examiner* — Jany Richardson (57) ABSTRACT

Apparatuses and methods of signal-flow aware supply routing are described. A programmable routing system is configured to route supply signals from a supply generator circuit to one or more functional blocks based on signal channels of the functional blocks.

20 Claims, 8 Drawing Sheets

SIGNAL PATH AWARE ROUTING OF SUPPLY VOLTAGES

RELATED APPLICATIONS

This application claims the benefit of U.S. Provisional Application No. 61/621,408, filed Apr. 6, 2012, the entire contents of which are incorporated by reference.

TECHNICAL FIELD

The present disclosure relates generally to microcontrollers and particularly to microcontrollers as part of a mixed-signal array.

BACKGROUND

Microcontrollers may have embedded processors, memories and special function analog and digital circuits. Typical analog circuits found in prior art microcontrollers include Continuous Time (CT) amplifiers having preset functions with given functional parameters. For instance, a CT analog amplifier might be configured as a fixed function circuit, such as a voltage amplifier, in which certain parameters, such as gain or bandwidth might be altered by programming.

Switched Capacitor (SC) analog circuits are also frequently incorporated into microcontroller designs. SC analog circuits in prior art are somewhat more versatile than CT analog circuits in that it might be possible to alter both the circuit function as well as the parameters of the circuit function by programming. However, both CT and SC analog circuits found in current microcontrollers generally require programming before utilization, and neither can be dynamically programmed (programmed "on-the-fly").

In the conventional art, general purpose digital circuits may be included in a microcontroller implementation. Such digital circuits are pre-programmed to realize certain digital functions such as logical operations, arithmetical functions, counting, etc. These digital circuits are generally in the form of a Programmed Logic Array (PLA) or FPGA. Furthermore, such digital circuits that require pre-programming are generally not dynamically programmable (programmable "on-the-fly"). The main difficulty here is in the generality of such a digital circuit, which requires an excessive amount of digital logic, which in turn occupies a large area on a semiconductor chip as well as an increased cost of manufacturing.

Several other design considerations related to microcontroller utilization either go unaddressed, or require separate functionalities to enable them. For instance, existing designs do not offer a programmable analog circuit array with both CT analog circuits and SC analog circuits on the same semiconductor chip with a programmable array of digital circuits. As a result, realization of a function requiring complex communication between analog circuits and digital circuits often requires the use of multiple semiconductor chips. Further, existing microcontroller realizations generally require pre-programming and cannot be dynamically programmed.

BRIEF DESCRIPTION OF THE DRAWINGS

The present invention is illustrated by way of example, and not of limitation, in the figures of the accompanying drawings in which.

DETAILED DESCRIPTION

Apparatuses and methods of signal-flow aware supply routing are described. In one embodiment, a programmable routing system is configured to route supply signals from a supply generator circuit to one or more functional blocks based on signal channels of the functional blocks. In the following description, for purposes of explanation, numerous specific details are set forth in order to provide a thorough understanding of the present invention. It will be evident, however, to one skilled in the art that the present invention may be practiced without these specific details. In other instances, well-known circuits, structures, and techniques are not shown in detail, but rather in a block diagram in order to avoid unnecessarily obscuring an understanding of this description.

Reference in the description to "one embodiment" or "an embodiment" means that a particular feature, structure, or characteristic described in connection with the embodiment is included in at least one embodiment of the invention. The phrase "in one embodiment" located in various places in this description does not necessarily refer to the same embodiment.

Figure 1:
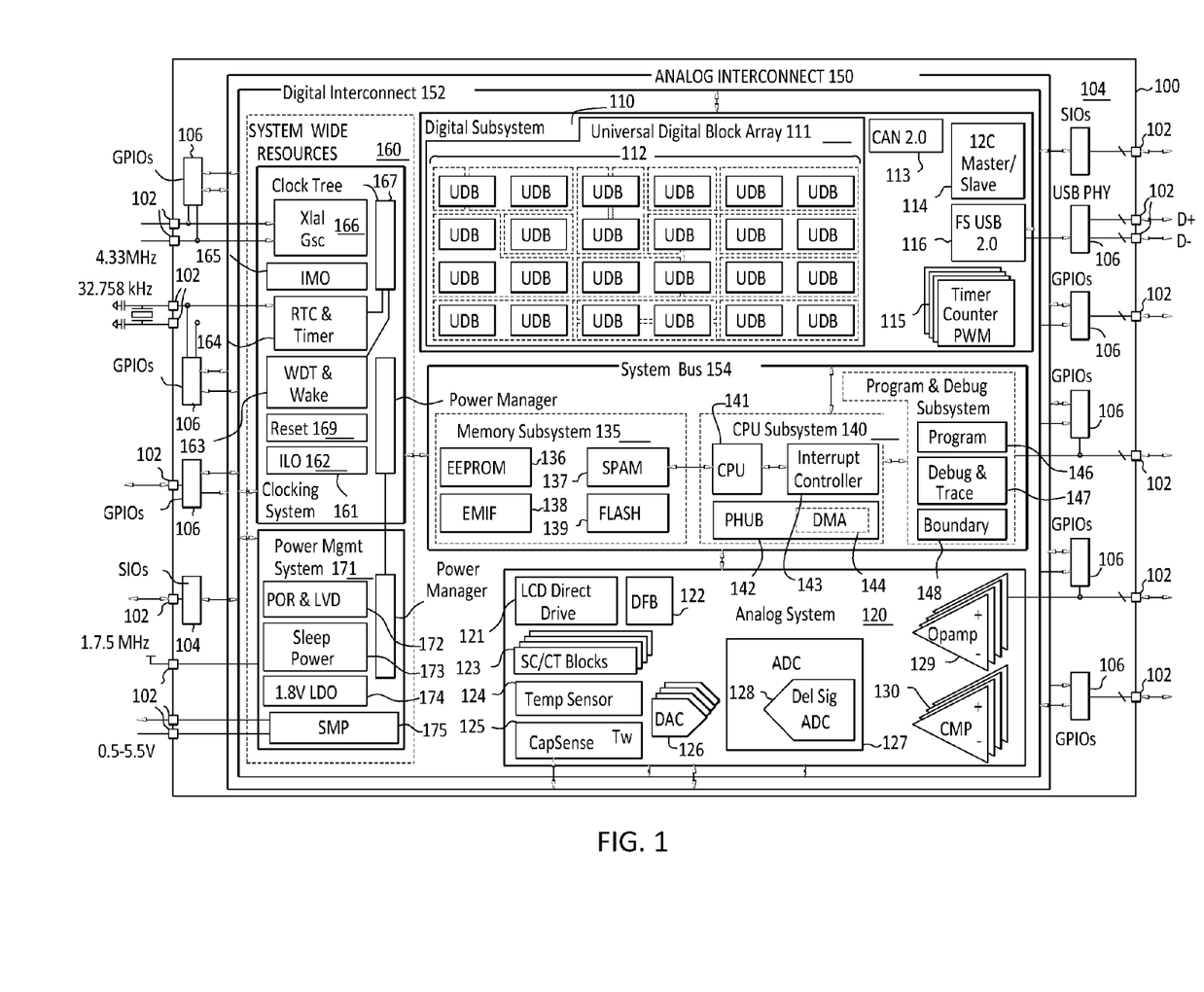
FIG. 1 illustrates an embodiment of a core architecture of a processing device with a programmable routing system for routing of supply voltages.

FIG. 1 illustrates an embodiment of a core architecture of a processing device 100 with a programmable routing system 126 for routing of supply voltages. In one embodiment, the processing device 100 is a core architecture of the Programmable System-on-Chip (PSoC®) device, such as that used in the PSoC® family of products offered by Cypress Semiconductor Corporation (San Jose, Calif.). In one embodiment, the processing device 100 has the PSoC®3 or PSoC®5 core architecture, each developed by Cypress Semiconductor Corporation. Alternatively, the processing device 100 may be other types of integrated circuits as would be appreciated by one of ordinary skill in the art having the benefit of this disclosure.

In one embodiment, the core architecture includes a digital subsystem 110. The digital subsystem 110 includes a universal digital block array 111, including multiple universal digital blocks (UDBs) 112, a CAN 2.0 interface controller (CAN 2.0) 113, an I2C Master and Slave controller (I2C M/S) 114, multiple multifunction digital blocks (MDBs) 115 and a full-speed USB 2.0 interface controller (FSUSB 2.0) 116. MDBs 115 may be configured to perform common digital functions such as timers, counters and pulse-width modulators (PWMs). Digital subsystem 110 may also include communication peripherals such as Ethernet, high-speed USB, USB host, PCI Express, IEE1394 serial bus interface, SD card reader and others (not shown) The elements of digital system 110 may be coupled to digital interconnect 152 and/or to the system bus 154.

The core architecture may also include an analog subsystem 120. The analog subsystem may include an LCD direct drive block 121, a digital filter block (DFB) 122, multiple switched-capacitor/continuous time mixed-function analog (SC/CT) blocks 123, a temperature sensor block 124, a capacitive sensing (CapSense™) block 125, multiple digital-to-analog converters 126, an analog-to-digital converter (ADC) 127 including a delta-sigma ADC 128, multiple operational amplifiers (opamps) 129 and multiple comparators (CMP) 130. Analog subsystem 120 may include successive approximation registers (SARs), programmable gain amplifiers (PGAs) and other analog peripherals (not shown). The elements of analog subsystem 120 may be coupled to analog interconnect 150 and/or the system bus 154. CapSense™ block 125 may be coupled to the analog interconnect 150 separate from other elements of analog subsystem 120.

The core architecture 100 may also include memory subsystem 135, CPU subsystem 140 and programming and debug subsystem 145. Memory subsystem 135 may include an EEPROM block 136, synchronous random access memory (SRAM) 137, an external memory interface (EMIF) block 138, and flash memory (FLASH) 139. Memory subsystem 135 may also include a memory cache or memory accelerator (not shown). CPU subsystem 140 may include a CPU 141, an interrupt controller 142 and a bus bridge controller (DMA/PHUB) 143, which may include a direct memory access (DMA) controller 144. The program and debug subsystem 145 may include a programming block 146, and debug and trace block 147 and a boundary scan block 148. The program and debug subsystem may be coupled to the CPU subsystem. The CPU subsystem and the memory system may be coupled to system bus 154. The memory subsystem 135 may be coupled to the CPU subsystem 140 through the system bus 154. In one embodiment, FLASH 139 may be coupled to the CPU 141 directly.

The core architecture 100 may also include system-wide resources 160. System-wide resources may include a clocking subsystem 161 and power management subsystem 171. Clocking subsystem 161 may include an internal low-speed oscillator block (ILO) 162, a watch-dog timer (WDT) and wake-up controller block 163, a real-time clock (RTC)/timer block 164, an internal main oscillator block (IMO) 165, a crystal oscillator block (Xtal Osc) 166, a clock tree 167, power manager 168 and reset block 169. In one embodiment the RTC/timer block 164 and the ILO 162 may be coupled to the WDT and wake-up controller block 163. In another embodiment, clock tree 167 may be coupled to Xtal Osc block 166 and IMO 165. Power management system 171 may include power-on-reset (POR) and low-voltage-detect (LVD) block 172, a sleep power block 173, a 1.8V internal regulator (LDO) 174, a switched mode power supply (e.g., switch-mode pump, SMP) 175 and power manager 178. The switched mode power supply may implement a boost circuit, a bust circuit or both. Power manager 178 may be coupled to power manager 168 of the clocking subsystem 161. In one embodiment, system-wide resources 160 may be coupled to system bus 154.

The core architecture 100 may also include multiple pins 102. Pins 102 may be used to connect elements of core architecture 100 to off-chip elements or route signals into, out of on-chip elements or to different pins of the device. Core architecture 100 may also include multiple special input/outputs (SIOs) 104 and general purpose input/outputs (GPIOs) 106. SIOs 104 may be coupled to digital interconnect 152. GPIOs 106 may be coupled to analog interconnect 150, digital interconnect 152, RTC/timer block 164, and/or Xtal Osc block 166. Core architecture may also include USB input/outputs (USB PHY) 108, which may be coupled to FSUSB 2.0 116.

In one embodiment, the programmable routing system 126 is implemented in the analog subsystem 120. In one embodiment, the programmable routing system 126 includes a first programmable interconnect for configuring a first set of programmable signal paths as signal channels between functional blocks. The programmable routing system 126 also includes a second programmable interconnect for configuring a second set of supply paths as supply channels base on the first set of programmable signal paths. In another, the programmable routing system 126 can be implemented in other locations as would be appreciated by one of ordinary skill in the art having the benefit of the disclosure. For example, when the programmable routing system is used to route supply signals for digital components, the programmable routing system 126 may be implemented in whole or in part in the digital subsystem 110. Details regarding the programmable routing system 126 are described below with respect to FIG. 3-8.

Figure 2:
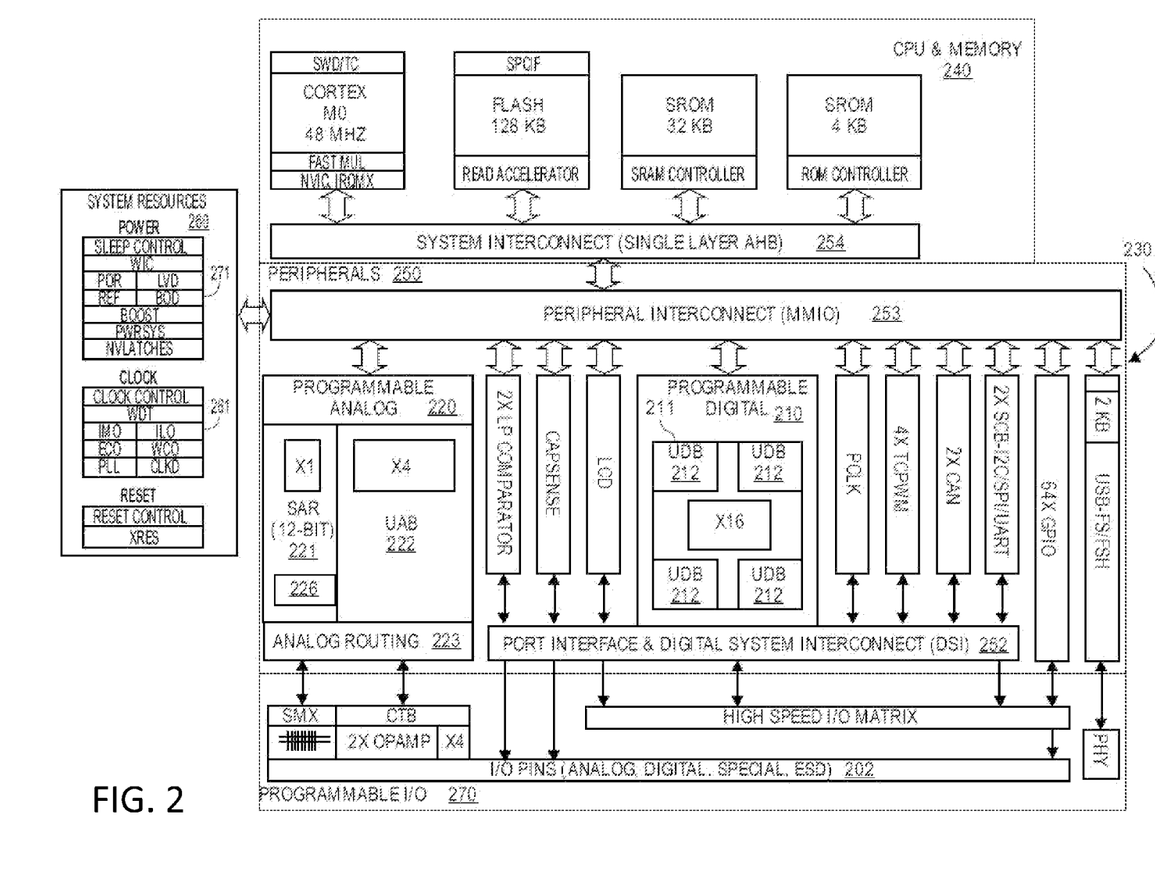
FIG. 2 illustrates another embodiment of a core architecture of a processing device with a programmable routing system for routing of supply voltages.

FIG. 2 illustrates another embodiment of a core architecture of a processing device 200 with a programmable routing system 226 for routing of supply voltages. In one embodiment, the processing device 200 has the PSoC®4 core architecture, developed by Cypress Semiconductor Corporation. In the depicted embodiment, the processing device 200 includes a CPU and memory subsystem 240, peripherals 250, system resource 260, and programmable I/O 270. The peripherals 250 include a peripheral interconnect (MMIO) 253), programmable digital subsystem 210, programmable analog subsystem 220, a port interface and digital system interconnect (DSI) 252), and various other components 230, such as comparators, capacitive sensing blocks, LCD direct drive blocks, a CAN interface controller, an I2C M/S, MDBs, and a FSUSB 2.0, as described herein. The MDBs may be configured to perform common digital functions such as timers, counters and pulse-width modulators (PWMs). The various other components may be communication peripherals such as Ethernet, high-speed USB, USB host, PCI Express, IEE1394 serial bus interface, SD card reader and others. The programmable digital subsystem 210 and some of the other components 230 are coupled to the port interface and digital subsystem interconnect (DSI) 252. The programmable digital subsystem 210, the programmable analog subsystem 220 and the other components 230 are coupled to the peripheral interconnect (MMIO) 253. The programmable analog subsystem 220 and some of the other components 230 are coupled to the programmable I/O 270.

The digital subsystem 210 includes a universal digital block array 211, including multiple UDBs 212. The digital subsystem 210 my also include other interface controller, multifunction digital blocks, communication peripherals, or the like. The elements of digital system 210 may be coupled to digital interconnect 252 and/or to a peripheral interconnection (MMIO) 253, which is coupled to the system interconnect 254 of a CPU and memory subsystem 240. The CPU and memory subsystem 240 may include FLASH, SRAM, SROM blocks and a CPU, each coupled to the system interconnect 254. The CPU and memory subsystem 240 may include other components as would be appreciated by one of ordinary skill in the art having the benefit of this disclosure.

The core architecture 200 may also include an analog subsystem 220. The analog subsystem 220 may include successive approximation registers (SARs) ADC block 221, programmable universal analog blocks (UABs) 222, and analog routing 223. In one embodiment, the programmable routing system 226 is implemented in the SAR 221. In another embodiment, the programmable routing system 226 is implemented in one or more other components of the programmable analog subsystem 220. In another, the programmable routing system 226 can be implemented in other locations as would be appreciated by one of ordinary skill in the art having the benefit of the disclosure. For example, when the programmable routing system is used to route supply signals for digital components, the programmable routing system 226 may be implemented in whole or in part in the digital subsystem 210. Details regarding the programmable routing system 226 are described below with respect to FIG. 3-8.

The core architecture 200 may also include system-wide resources 260. System-wide resources 260 may include a clocking subsystem 261 and power management subsystem 271. Clocking subsystem 261 may include various components as described herein, such as ILO, WDT, clock control, IMO, ECO, PLL, CLKD, WCO, or the like. Power management system 171 may include various components as described herein, such as sleep control, WIC, POR, LVD, REF, BOD, Boost, PWRSYS, NV latches, or the like. In one embodiment, system-wide resources 260 may be coupled to peripheral interconnect 253.

The core architecture 200 may also include multiple pins 202. Pins 202 may be used to connect elements of core architecture 200 to off-chip elements or route signals into, out of on-chip elements or to different pins of the device. Core architecture 200 may also include multiple SIOs and GPIOs. The programmable I/O 270 also may include a high speed I/O matrix, a physical interface (PHY), SARMUX (e.g., multiplexer into a successive approximately register (SAR) converter), CTB, and the like. Core architecture 200 may also include USB input/outputs (USB PHY) 108, which may be coupled to FSUSB 2.0 116.

FIG. 2 illustrates the programmable routing system 226 as being part of the analog subsystem 220 in the context of the entire core architecture of the processing device 200. It should be noted that the embodiments described herein are described in the context of the analog subsystem 220, but may be applied to other parts of the processing device, such as capacitive sensing, touch sensing, LP comparators, or the like.

Figure 3:
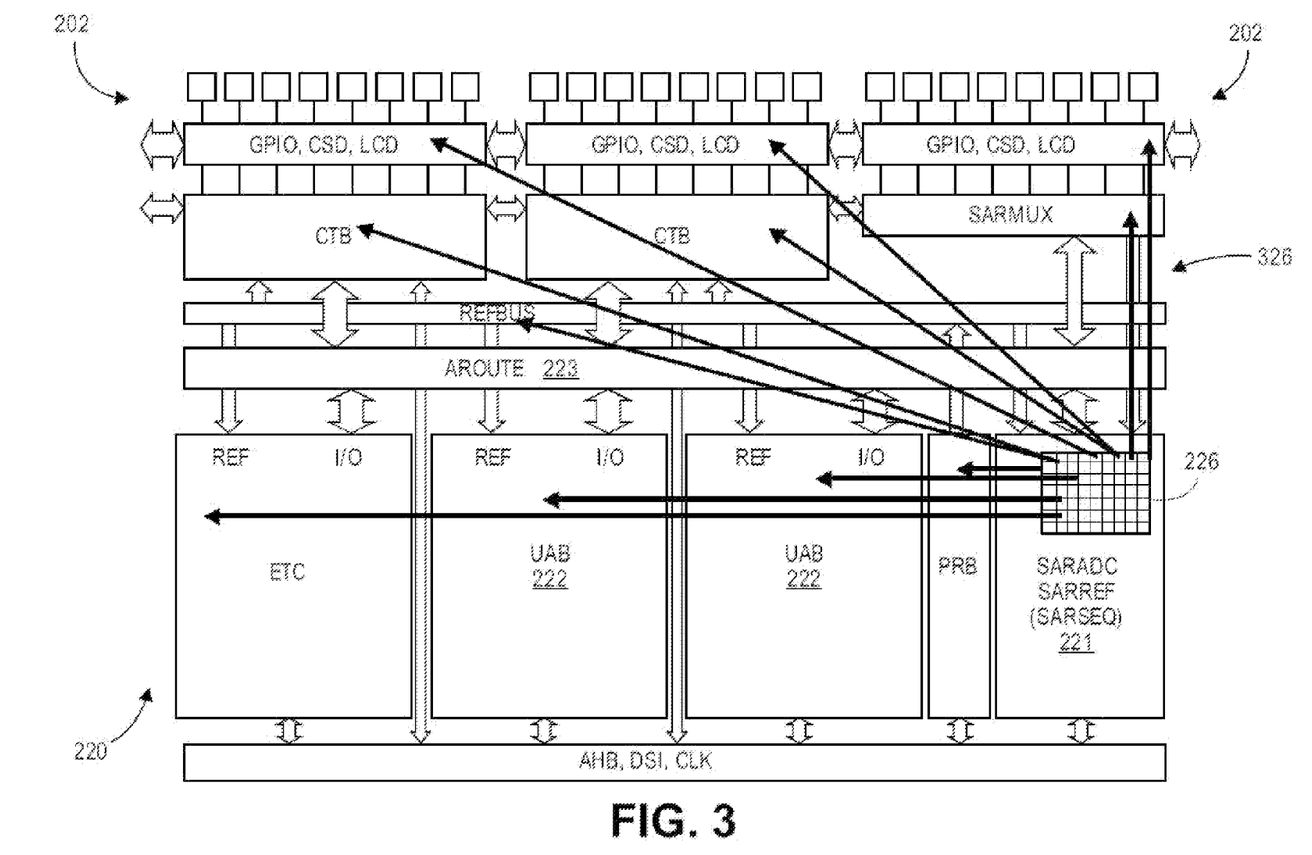
FIG. 3 illustrates an embodiment of a programmable analog subsystem with the programmable power supply routing system located in and sourced from the SAR ADC block.

Within the context of the programmable analog subsystem 220, the programmable routing system 226 can feed the analog components as illustrated in FIG. 3.

FIG. 3 illustrates an embodiment of the programmable analog subsystem with the programmable power supply routing system 226 sourced from the SAR ADC block 221. In one, the programmable routing system 226 includes one or more charge pumps and the programmable routing system 226 is configured to route supply channels 326 to the analog components of the programmable analog subsystem 220. The routed supply channels 326 may be multi-supply buses that are selectable at the sinking point for the supplies to allocate supply channels to correspond to the signal channels. It should also be noted that supply channels 326 can be used for routing supply signals, shield signals, grounds, or substrate nets as would be appreciated by one of ordinary skill in the art having the benefit of this disclosure. As such, the programmable routing system 226 is configured to route these different types of power supply signals via the supply channels based on the signal channels. Although illustrated in the SAR ADC block 221, the programmable routing system 226 can be implemented in other blocks of the analog subsystem 220.

In general, circuits need power supply nets and shielding nets. Often a system designer is compelled to produce supplies and shields for multiple channels on a chip or in a system and must pay careful attention to crosstalk between channels that may occur due coupling through shared supply or shield nets. In the case of fixed systems, where channels are predetermined these supplies may be treated with care and the problem mitigated. In a programmable system, this system tradeoff is difficult to anticipate and may result in overdesign of supplies (to mitigate potential crosstalk issues) or may result in noise/crosstalk coupling issues.

To optimize system design and use of that system, the embodiments described herein propose that supplies and shields be an allocable resource just as there are other pieces of the programmable system. Power supply connections, including externally sourced positive/negative supplies, pumped positive/negative supplies, grounds, substrate and well connections, are sources of channel-to-channel crosstalk within a system. When these resources can be allocated and routed based on signal paths and their transported information in a system, that system can be improved and the cost of these supplies can be reduced. The embodiments described herein provide routing of supply signals and shield signals based on signal paths to improve signal fidelity and reduce the cost of generating the supply/shield signals because the signals do not have to support channel-to-channel rejection. By generating and routing supply/shield signals with significant metal width and bypassing, a larger area and power consumption for generated supply/shield signal results.

The embodiments describe herein separate supply and shield resources into channelizable segments. The embodiments can be used to allocate use of these resources based on channelization and signal payload of different channels. The embodiment can also be used to route these resources in a processing device. The embodiments describe herein can also be used to dynamically allocate and route supply and shield resources based on a system state or system activity.

Figure 4:
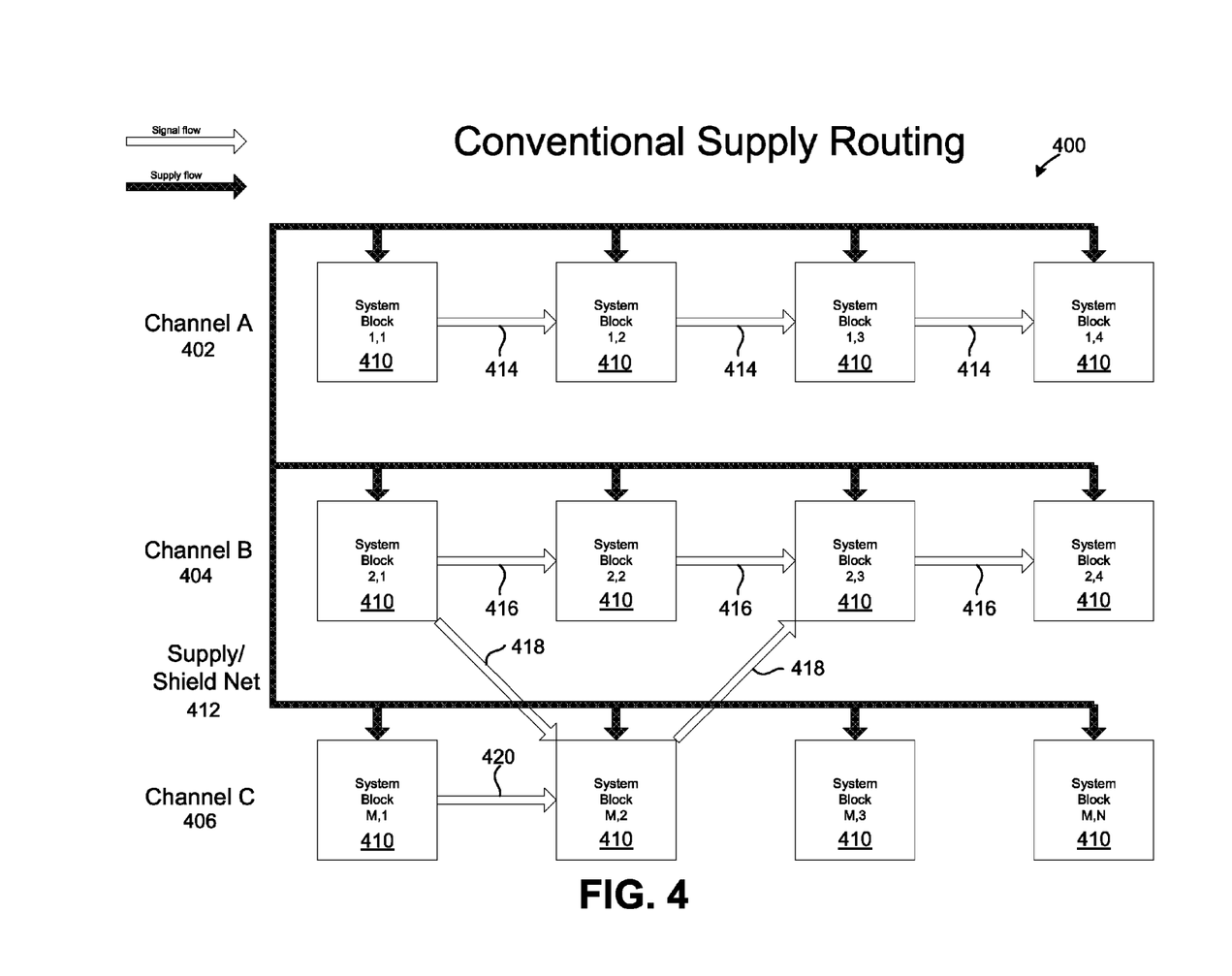
FIG. 4 is a block diagram of an embodiment of conventional supply routing to multiple system blocks.

FIG. 4 is a block diagram of an embodiment of conventional supply routing 400 to multiple system blocks 410. Supply routing 400 is supplies a supply net or a supply shield to multiple system blocks 410 regardless of the signal paths of the multiple channels. For example, in the depicted embodiment, there are three channels, channel A 302, channel B 304, and channel C 306. Channel A 302 has a signal path 314 between four system blocks 410. The signal flow of the signal path 314 is from left to right between the four system blocks 410. Channel B 304 has a signal path 316 from left to right between the four system blocks 410. Channel B 304 also has a signal path 318 from the first system block 410 to a second system block 410 of Channel C 306, and back to the third system block 410 of channel B 304. Channel C 306 also has a signal path 320 between the first two system blocks 410. The supply/shield net 312 is coupled to each of the three channels. More specifically, the supply/shield net 312 is coupled to each of the system blocks of the three channels. Because the supply/shield net 312 is coupled to all three channels, there is a possibility of channel-to-channel crosstalk as described herein.

Figure 5:
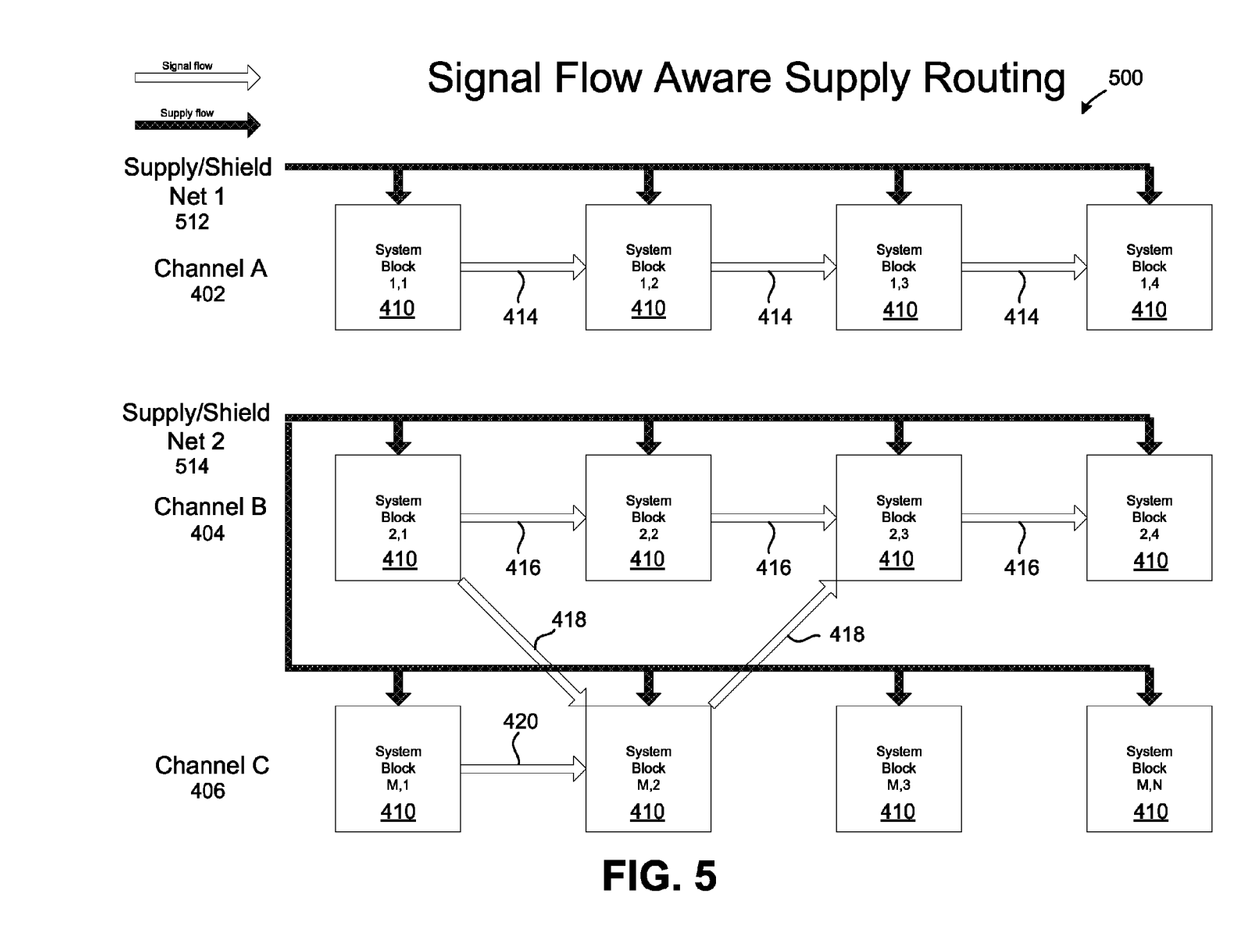
FIG. 5 is a block diagram of another embodiment of supply routing to multiple system blocks based on signal routing.

FIG. 5 is a block diagram of another embodiment of supply routing 500 to multiple system blocks 410 based on signal routing. Supply routing 500 has the same setup as supply routing 400 as designated by similar reference labels. However, supply routing 500 allocates and routes the supply/shield nets 512 and 514 according to the signal paths of the system blocks of the different channels. In particular, the first supply/shield net 512 is coupled to the system blocks 410 of channel A 402. The second supply/shield net 514 is coupled to the system blocks 410 of channel B 404 and channel C 406. In this manner, the supply/shield net 512 can isolate channel A 402 from channel B 404 and channel C 406. In this embodiment, the signal paths 414, 416, 418, and 420 are configured as a first set of signal paths to route signal channels between the multiple functional blocks of the processing device and a second set of supply paths as supply channels that are based on the first set of signal paths. The supply routing 500 can be configured to have multiple system blocks 410 in multiple channels, each channel having one of the signal paths between at least two system blocks. The supply routing 500 is configured to have the supply routing with one of the second set of supply paths to each of the channels. The supply channels may correspond one-to-one with the channels. Alternatively, the supply channels may correspond to more than one channel, such as illustrated in FIG. 5.

In one embodiment, the supply/shield net 512 is configured to route a supply signal. In another embodiment, the supply/shield net 512 is configured to route a shield signal. In another, the supply/shield net 512 and supply/shield net 514 are configured to route different supply signals or different shield signals. In another embodiment, the supply/shield net 512 is configured to route a supply signal and supply/shield net 514 is configured to route a shield signal. Alternatively, the supply/shield net 512 is configured to route a shield signal and the supply/shield net 514 is configured to rout a supply signal. Of course, other number of channels, signal paths, supply signals, shield signals may be used in other configurations as would be appreciated by one of ordinary skill in the art having the benefit of this disclosure.

In one embodiment, the system blocks 410 are programmable analog blocks. In another embodiment, the system blocks 410 are programmable analog and digital blocks. In another embodiment, the system blocks 410 are digital blocks. Alternatively, the system blocks 410 may be other circuits of a processing device as would be appreciated by one of ordinary skill in the art having the benefit of this disclosure. In one embodiment, the system blocks 410 are programmable system blocks 410. In another embodiment, the system blocks 410 may be programmable and non-programmable blocks (e.g., fixed-function blocks), or just non-programmable blocks.

Figure 6:
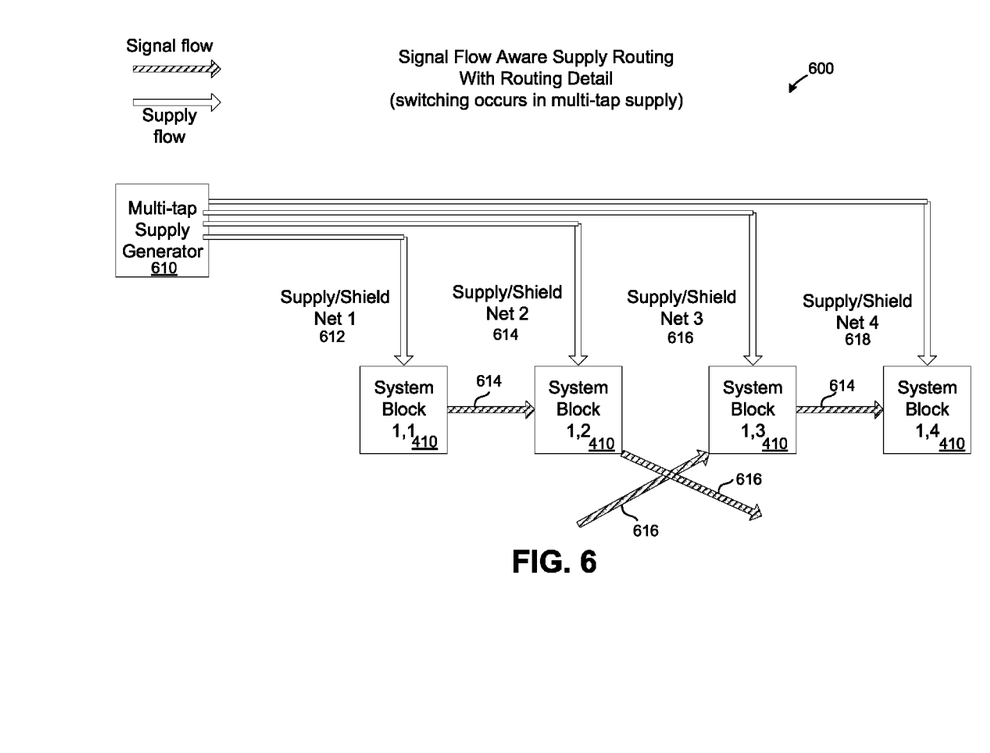
FIG. 6 is a block diagram of another embodiment of supply routing to multiple system blocks from a multi-tap supply generator.

In another embodiment, supply/shield nets 512 and 514 are configured to receive supply or shield signals from a multi-tap supply generator, such as illustrated in FIG. 6. In another embodiment, supply/shield nets 512 and 514 are configured to receive supply or shield signals from multiple independent supply generators, such as illustrated in FIG. 7.

FIG. 6 is a block diagram of another embodiment of supply routing 600 to multiple system blocks 410 from a multi-tap supply generator 610. The multi-tap supply generator 610 is configured to generate multiple outputs, which are coupled to the multiple supply/shield nets 612-618. In this manner, the system blocks 410 can be connected to any one of the multiple outputs of the multi-tap supply generator 610. The routing of multiple supply or shield signals to the different system blocks occurs in the multi-tap supply generator 610. It should be noted that the multi-tap supply generator 610 may include a passive structure, such a ground or substrate net, to provide a ground or a shield signal. For example, the supply/shield nets 612-618 could be configured to receive the same supply signal or the same shield signal. Alternatively, the supply/shield nets 612-618 can be configured to receive any combination of supply signals or shield signals.

Figure 7:
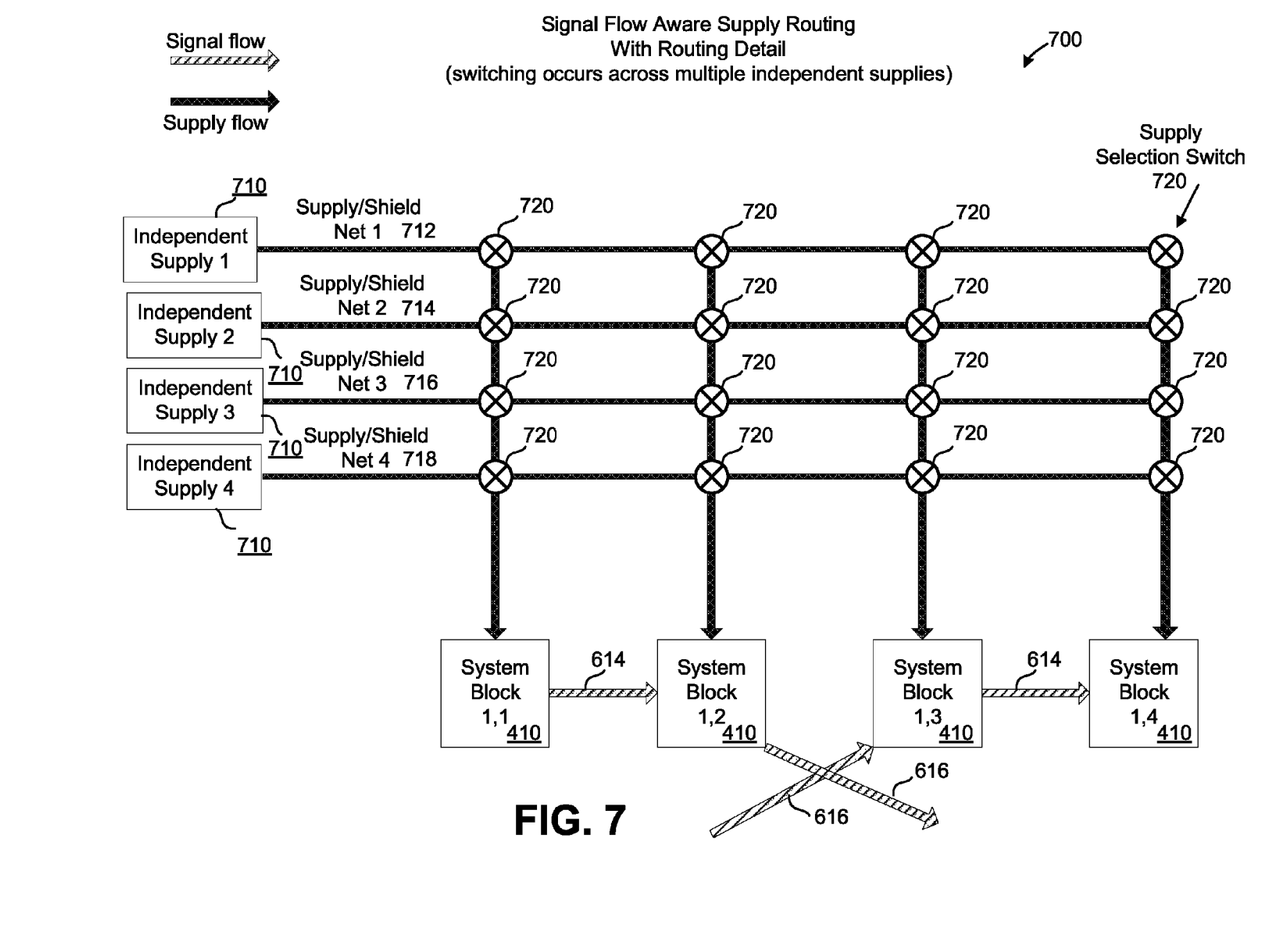
FIG. 7 is a block diagram of another embodiment of supply routing to multiple system blocks from multiple independent supply generators.

FIG. 7 is a block diagram of another embodiment of supply routing 700 to multiple system blocks 410 from multiple independent supply generators 710. The multiple independent supply generators 710 are each configured to generate a supply signal or a shield signal. For example, in one embodiment, the independent supply generators 710 can be a passive structure, such as a ground or a substrate net when supplying a shield signal or ground. The independent supply generators 710 are coupled to a matrix of one or more supply selection switches 720. The outputs of the supply selection switches 720 are coupled to the system blocks 410. In this manner, the system blocks 410 can be connected to any one of the multiple independent supply generators 710 to receive any one of the different supply signals or shield signals. The routing of multiple supply or shield signals occurs across multiple independent supplies, as compared to the multi-tap supply generator. In one embodiment, the matrix of supply switches 720 is configured to connect one of the supply channels to one of more of the system blocks 410.

Figure 8:
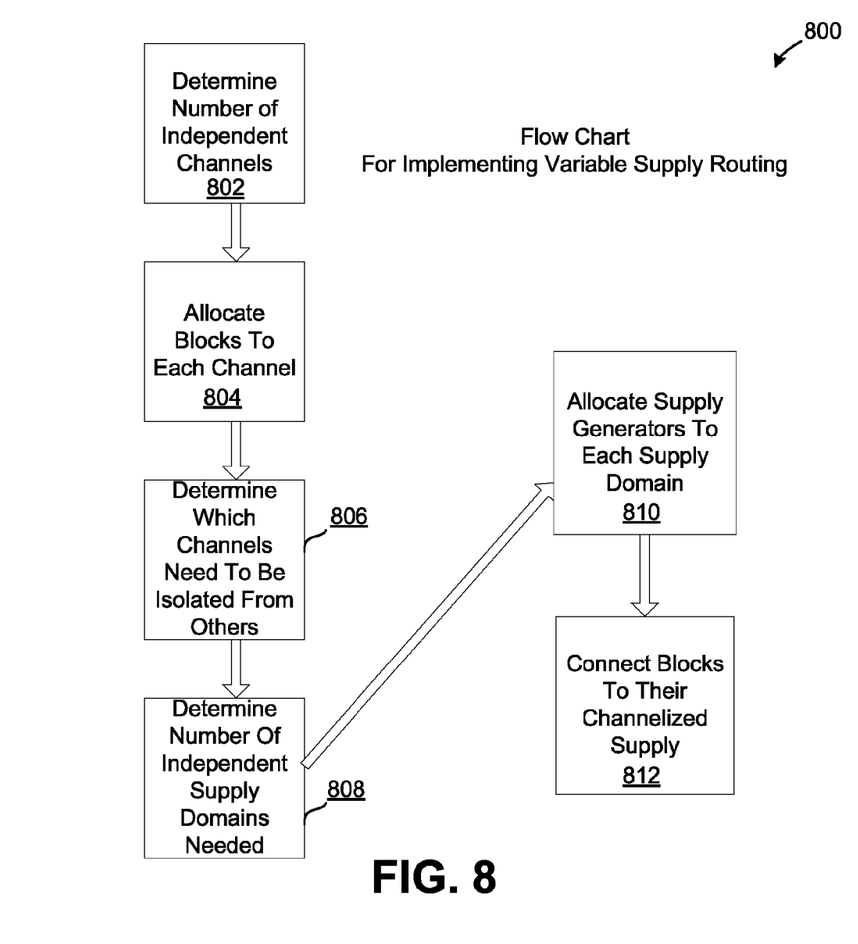
FIG. 8 is a flow diagram of a method of programming variable supply routing according to one embodiment.

FIG. 8 is a flow diagram of a method 800 of programming variable supply routing according to one embodiment. The method 800 may be performed by processing logic that may include hardware (circuitry, dedicated logic, etc.), software (such as is run on a general purpose computing system or a dedicated machine), firmware (embedded software), or any combination thereof. In one embodiment, the processing device 100 or 200 performs the method 800. In another embodiment, the analog subsystem 120 or 220 performs the method 800. In another embodiment, the programmable routing system 126 or 226 performs the method 800.

Referring to FIG. 8, the method 800 begins with determining the number of independent channels (block 802). Next, the processing logic allocates blocks to each of the channels (block 804). The processing logic determines which channels need to be isolated from other channels (block 806). The processing logic also determines the number of independent supply domains needed (block 808), and allocates supply generator(s) to each supply domain (block 810). Next, the processing logic connects the blocks to their channelized supply domain (block 812), and the method 800 ends.

In another embodiment of the method, the processing logic determines a first number of independent channels of a processing device. Next, processing logic allocates a second number of functional blocks to each of the first number of independent channels. The processing logic determines a third number of supply domains to be used by the first number of independent channels and allocates a fourth number of supply generators to each of the third number of independent supply domains. The processing logic connects one or more of the first number of independent channels to the fourth number of supply generators.

In yet a further embodiment, the processing logic determines which of the first number of independent channels need to be isolated from one another. In a further embodiment, the processing logic connects connecting each of the functional blocks of the respective independent channel to the respective one of the supply generators. In another embodiment, the processing logic provides a supply signal or a shield signal to one the first number of independent channels using one of the fourth number of supply generators. As described herein, these blocks may be programmable analog blocks or other blocks as described herein.

In another embodiment, a user develops system implementation based on resources available on the processing device. The user allocates resources based on the system implementation. Signal paths are configured between the allocated resources based on the allocation of those resources. The user then allocates the supplies and shields to those allocated resources based on the signal flow of the signal paths and the resource usage. In a further embodiment, these supplies and shields can be re-routed as needed during system state changes or changes in system activity as would be appreciated by one of ordinary skill in the art having the benefit of this disclosure.

The embodiments described herein can allows the supply and shields nets to be designed with less rigid outputs, resulting in thinner routing and less bypassing. In some cases, this may reduce the bypassing area by 20%. The embodiments describe herein may also be used to reduce crosstalk from channel to channel. In some cases, the crosstalk can go from 80 dB to 100 dB of isolation. Alternatively, other reductions may be achieved as would be appreciated by one of ordinary skill in the art having the benefit of this disclosure.

Using the embodiments described herein, the processing device can be programmed to plan for allocable supplies. The processing device can have the appropriate routing and control for these allocable supplies. The user can be aware of the signal paths and the signal flow between blocks using various tools and route the allocable supplies accordingly. The same tool used to route signal paths can be configured to route the allocable supplies based on the signal paths.

Embodiments of the present invention, described herein, include various operations. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a computer-readable medium. These instructions may be used to program a general-purpose or special-purpose processor to perform the described operations. A computer-readable medium includes any mechanism for storing or transmitting information in a form (e.g., software, processing application) readable by a machine (e.g., a computer). The computer-readable storage medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory, or another type of medium suitable for storing electronic instructions. The computer-readable transmission medium includes, but is not limited to, electrical, optical, acoustical, or other form of propagated signal (e.g., carrier waves, infrared signals, digital signals, or the like), or another type of medium suitable for transmitting electronic instructions.

Additionally, some embodiments may be practiced in distributed computing environments where the computer-readable medium is stored on and/or executed by more than one computer system. In addition, the information transferred between computer systems may either be pulled or pushed across the transmission medium connecting the computer systems.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method comprising:
configuring a first set of programmable signal paths as signal channels between a plurality of functional blocks using a first programmable interconnect of an integrated circuit; and
configuring a second set of supply paths as supply channels based on the first set of programmable signal paths using a second programmable interconnect.

2. The method of claim 1, wherein the configuring the first set of programmable signal paths comprises configuring the plurality of functional blocks into a plurality of channels, each channel comprising at least one of the first set of programmable signal paths between at least two of the plurality of functional blocks, and wherein the configuring the second set of supply paths comprises allocating one of the second set of supply paths to each of the plurality of channels.

3. The method of claim 1, further comprising generating a supply signal or a shield signal for each of the supply channels using independent supply generators.

4. The method of claim 1, further comprising generating a supply or a shield signal for each of the supply channels using a multi-tap supply generator.

5. The method of claim 1, wherein the configuring the second set of supply paths comprises activating a matrix of one or more supply selection switches, each of the supply selection switches to connect one of the supply channels to one or more of the plurality of functional blocks.

6. The method of claim 1, wherein the plurality of functional blocks are programmable analog blocks.

7. A method comprising:
determining a first number of independent channels of an integrated circuit;
allocating a second number of functional blocks to each of the first number of independent channels using a first programmable interconnect;
determining a third number of supply domains to be used by the first number of independent channels;
allocating a fourth number of supply generators to each of the third number of independent supply domains; and
connecting one or more of the first number of independent channels to the fourth number of supply generators using a second programmable interconnect.

8. The method of claim 7, further comprising determining which of the first number of independent channels need to be isolated from one another.

9. The method of claim 7, wherein the connecting comprises connecting each of the functional blocks of the respective independent channel to the respective one of the supply generators.

10. The method of claim 7, further comprising providing a supply signal or a shield signal to one the first number of independent channels using one of the fourth number of supply generators.

11. The method of claim 7, wherein the second number of functional blocks are programmable analog blocks.

12. An apparatus comprising
an integrated circuit comprising a plurality of signal channels between a plurality of functional blocks, wherein the integrated circuit comprises:
a supply generator circuit to provide a plurality of supply signals; and
a first programmable interconnect coupled to the supply generator circuit and configurable to route the plurality of supply signals based on the plurality of signal channels.

13. The apparatus of claim 12, wherein the integrated circuit comprises a second programmable interconnect configured to programmed to couple the plurality of signal channels between the plurality of functional blocks.

14. The apparatus of claim 12, wherein the supply generator circuit comprises a multi-tap supply generator.

15. The apparatus of claim 12, wherein the supply generator circuit comprises a plurality of independent supply generators.

16. The apparatus of claim 12, wherein the first programmable interconnect is configured to route a first supply signal of the plurality of supply signals to a first channel of the plurality of signal channels and to route a second supply signal of the plurality of supply signals to a second channel of the plurality of signal channels.

17. The apparatus of claim 16, wherein the first programmable interconnect is configured to route the second supply signal to a third channel of the plurality of signal channels.

18. The apparatus of claim 12, wherein the plurality of functional blocks are programmable analog blocks.

19. The apparatus of claim 12, wherein the first programmable interconnect comprises a matrix of one or more supply selection switches, each of the supply selection switches to connect one of the plurality of supply signals from the supply generator circuit to one or more of the plurality of functional blocks.

20. The apparatus of claim 12, wherein the integrated circuit comprises a digital subsystem and an analog subsystem, wherein the supply generator circuit and the first programmable interconnect are implemented in the analog subsystem.

* * * * *